United States Patent [19]
Zirngibl

[11] Patent Number: 5,600,742
[45] Date of Patent: Feb. 4, 1997

[54] WAVELENGTH GRATING ROUTER WITH OUTPUT COUPLER

[75] Inventor: Martin Zirngibl, Middletown, N.J.

[73] Assignee: Lucent Technologies Inc., Murray Hill, N.J.

[21] Appl. No.: 316,197

[22] Filed: Sep. 30, 1994

[51] Int. Cl.$^6$ .................................................... G02B 6/34
[52] U.S. Cl. ................... 385/37; 385/10; 385/46
[58] Field of Search ................................ 385/10, 28, 37, 385/46

[56] References Cited

U.S. PATENT DOCUMENTS

| | | | |
|---|---|---|---|
| 4,590,619 | 5/1986 | Winzer | 385/46 |
| 4,773,063 | 9/1988 | Hunsperger et al. | 385/37 |
| 4,784,935 | 11/1988 | Ehrfeld et al. | 385/37 |
| 4,786,133 | 11/1988 | Gidon et al. | 385/37 |
| 4,904,042 | 2/1990 | Dragone | 350/96.16 |
| 4,940,306 | 7/1990 | Kitayama et al. | 385/46 |
| 5,002,350 | 3/1991 | Dragone | 350/96.15 |
| 5,136,671 | 8/1992 | Dragone | 385/46 |
| 5,179,605 | 1/1993 | Kaverhad et al. | 385/37 |
| 5,243,672 | 9/1993 | Dragone | 385/46 |
| 5,339,157 | 8/1994 | Glance et al. | 385/24 |
| 5,341,444 | 8/1994 | Henry et al. | 385/24 |
| 5,367,586 | 11/1994 | Glance et al. | 385/46 |
| 5,371,818 | 12/1994 | Presby | 385/46 |
| 5,396,507 | 3/1995 | Kaminow et al. | 385/46 |

OTHER PUBLICATIONS

"Optimum design of a planar array of tapered waveguides", Optical Society of America, vol. 7, No. 11/Nov. 1990, pp. 2081–2093, C. Dragone.
"Polyarisation Independent 8×8 Waveguide Grating Multiplexer On InP", Electronics Letters, Jan. 1, 1993, vol. 29. No. 2, pp. 201–202, M. Zirngibl, et al.
"12 Frequency WDM Laser Based on a Transmissive Waveguide Grating Router" Electronics Letters, Apr. 28, 1994, vol. 30, No. 9, pp. 701–702, M. Zirngibl et al.
"Demonstration of a 15×15 Arrayed Waveguide Multiplexer on InP", IEEE Photonics Tech Ltrs., vol. 4, No. 11, Nov. 1992, pp. 1250–1253, M. Zirngibl, et al.

Primary Examiner—Rodney B. Bovernick
Assistant Examiner—Robert E. Wise

[57] ABSTRACT

The efficiency of an N×N waveguide grating router may be increased in many applications by incorporating at least one output waveguide, such as an $(N+1)^{st}$ waveguide, positioned for capturing second order diffraction optical energy from a free-space region in the router. The second order diffraction optical energy is delivered at a wavelength or at wavelengths corresponding to that wavelength or those wavelengths output on a particular associated one of the original N waveguide outputs for the router.

2 Claims, 3 Drawing Sheets

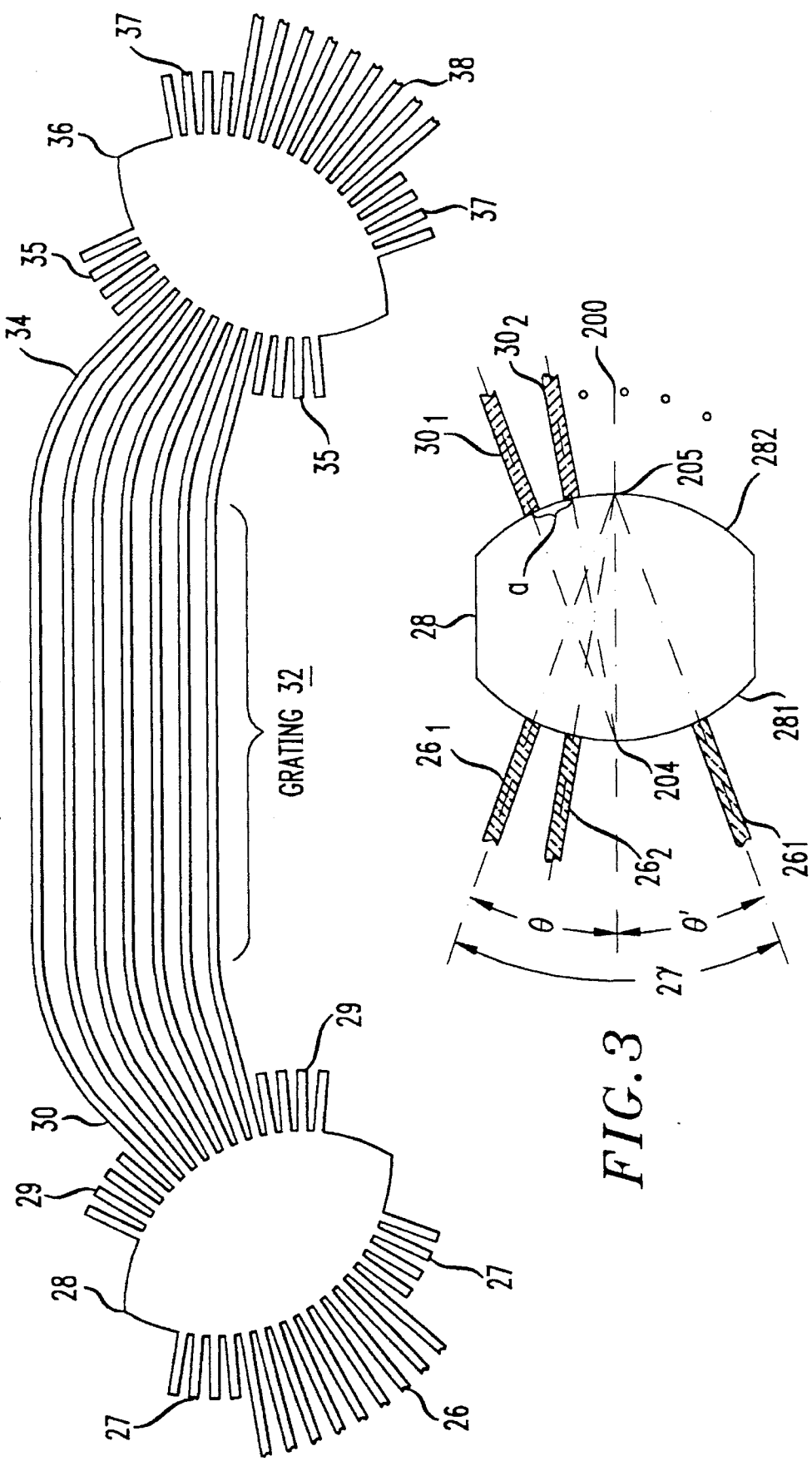

WAVELENGTH GRATING ROUTER WITH OUTPUT COUPLER

CROSS-REFERENCE TO RELATED APPLICATION

The application is related to U.S. Pat. No. 5,444,725 to Martin Zirngibl entitled "Multifrequency Laser," filed in the U.S. Patent and Trademark Office on even date herewith.

TECHNICAL FIELD

This invention relates to semiconductor lightwave devices and, more particularly, to a wavelength grating router.

BACKGROUND OF THE INVENTION

N×N waveguide grating routers are key components in wavelength division multiplexed (WDM) transmission systems and networks. These devices, also known as wavelength grating multiplexers and frequency routers, are compatible with many lightwave integrated semiconductor applications. These devices are described in U.S. Pat. Nos. 5,002,350, 5,136,671, and 5,243,672, all issued to C. Dragone. They incorporate an N×M star coupler as their main building block. This coupler is described in U.S. Pat. No. 4,904,042 issued to Dragone.

In all these router devices, input and output waveguides from the router couple first order diffracted light from the free space region of the router. One object in designing these routers has been to maximize the transfer of first order diffracted optical energy from the waveguide grating region to the input and output waveguides of the router. Another object has been to minimize the amount of energy radiated in higher order diffraction modes from the waveguide grating region in order to minimize the optical loss of the router. Obviously, the higher order diffraction modes are unwanted in such devices.

SUMMARY OF THE INVENTION

I have recognized that it is possible to increase the efficiency of an N×N waveguide grating router in many applications by incorporating at least one output waveguide, such as an $(N+1)^{st}$ waveguide, positioned for capturing second order diffraction optical energy from at least one free-space region in the router. The second order diffraction optical energy is delivered at a wavelength or at wavelengths corresponding to that wavelength or those wavelengths output on a particular associated one of the original N waveguide outputs for the router.

BRIEF DESCRIPTION OF THE DRAWING

A more complete understanding of the invention may be obtained by reading the following description of specific illustrative embodiments of the invention in conjunction with the appended drawing in which:

FIG. 2 shows a simplified diagram of the waveguides and free-space regions in a prior art N×N waveguide grating router;

FIG. 3 shows a simplified diagram of a modified portion of the waveguide grating router having a secondary or output waveguide for capturing second order diffraction optical energy.

DETAILED DESCRIPTION

A brief description of the prior art N×N waveguide grating router is being provided in order to develop a better understanding of the present invention and its departure from the prior art. This type of device has found application in the fields of filters, multiplexers, and lasers. In the description which follows, the terms "frequency" and "wavelength" may be used interchangeably when referring to the operation of the router.

Figure 1:
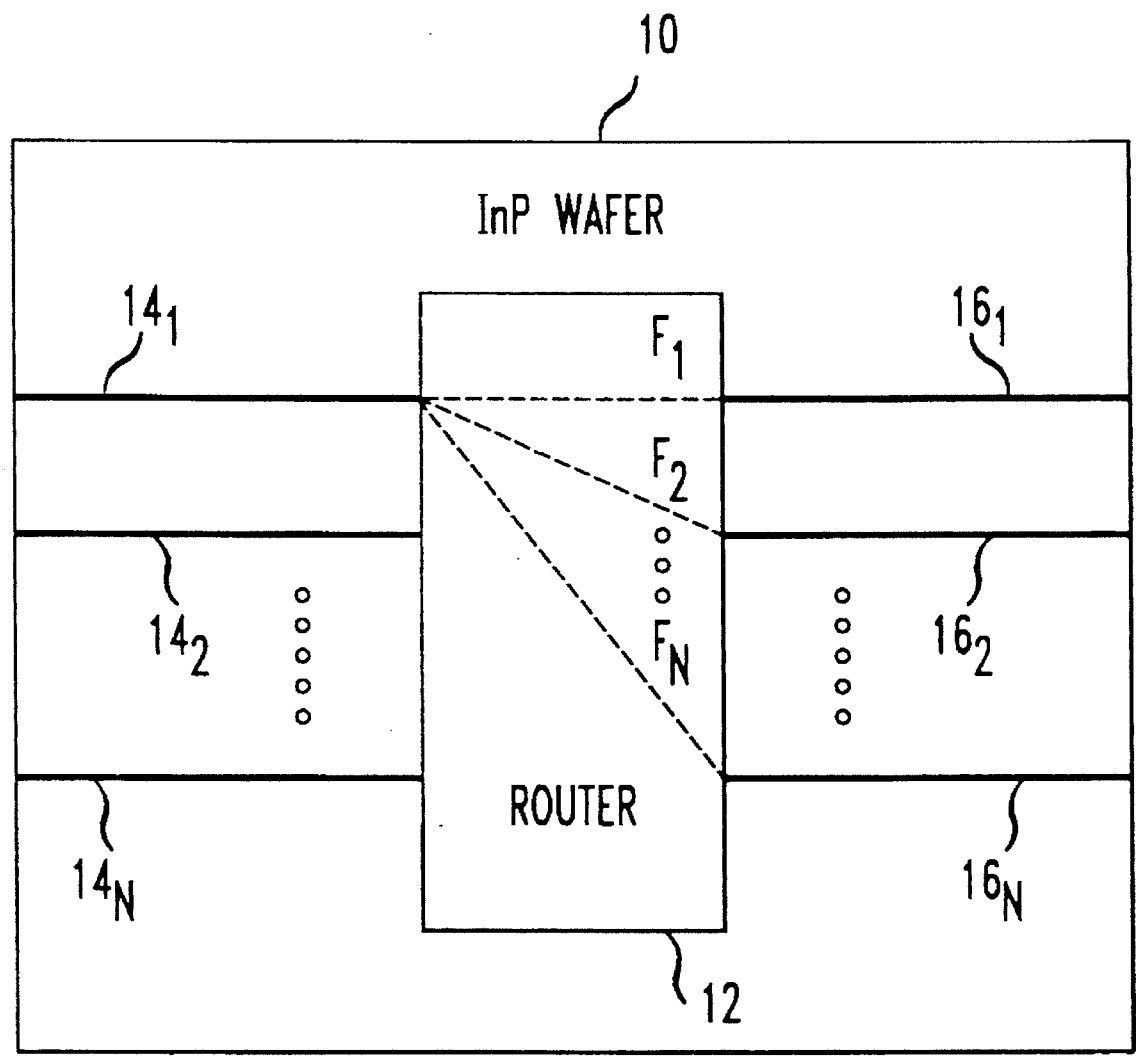
FIG. 1 shows a simplified schematic drawing of an N×N waveguide grating router known in the prior art.

FIG. 1 shows an example of a prior art waveguide grating router for providing frequency selectivity. It includes a number of waveguides extending from the router for carrying optical signals to and from the router. Constituent elements of the router shown in FIG. 1 may be monolithically integrated on a semiconductor wafer. These elements may be realized using known photolithographic and semiconductor growth techniques.

Wafer 10 in FIG. 1 is made of a semiconductor material such as a semiconductor compound from Group III–V. For example, the wafer and its grown regions can be realized primarily from layers of indium phosphide (InP) and an indium phosphide based material such as InGaAsP. Growth techniques such as MOCVD are contemplated for device fabrication.

As shown in FIG. 1, N×N waveguide grating router 12 is defined on wafer 10. A first plurality of waveguides $14_1$, $14_2$, ..., $14_N$ is connected to one end of waveguide grating router 12; a second plurality of waveguides $16_1$, $16_2$, ..., $16_N$ is connected to an opposite end of waveguide grating router 12. The waveguides are disposed at each end of the free space region at appropriate locations which correspond to only the presence of first order diffraction light energy from the waveguide grating. Waveguides 14 and 16 are realized in practice as buried rib waveguides.

Waveguide grating router 12 operates in such a way that an optical signal at frequency $F_1$ in waveguide $14_1$ is directed straight through router 12 to waveguide $16_1$ and vice versa. An optically transmissive path is thereby defined between the input and output ports of the router. This path for frequency $F_1$ comprises optical waveguide $14_1$, waveguide grating router 12, and optical waveguide $16_1$. This path is also known as a frequency selective pathway for frequency $F_1$.

For an optical signal in waveguide $14_1$ at frequency $F_2$, the router directs the optical signal from waveguide $14_1$ to waveguide $16_2$ and vice versa. In general, an optical signal having a frequency $F_i$ (i=1, 2, ..., N) appearing on waveguide $14_1$ and flowing toward the device 12 is directed to waveguide $16_i$ by the waveguide grating router. Similarly, an optical signal having a frequency $F_i$ appearing on a waveguide $16_i$ and flowing toward the waveguide grating router 12 is directed to waveguide $14_1$. The path through which the optical signal at frequency $F_2$ traverses the router is known as a frequency selective pathway for frequency $F_2$.

Additional details about operation and fabrication of router 12 are discussed in U.S. Pat. Nos. 5,002,350, 5,136,671, and 5,243,672, all issued to C. Dragone. It will be apparent to those persons skilled in the art that waveguides 14 serve as extensions of their corresponding waveguides in router 12, namely, waveguides 26 (FIG. 2). Similarly, waveguides 16 serve as extensions of the corresponding waveguides 38 (FIG. 2) in router 12.

FIG. 2 shows the pertinent details in simplified form of an exemplary of a waveguide grating router device 12 employed in FIG. 1. The waveguide grating router contains a plurality of input waveguides 26 connected to first free space region 28. A plurality of interconnecting waveguides 30 extends from the free space region 28 to optical grating waveguide region 32. Optical grating waveguide region 32 comprises a plurality of unequal length waveguides for providing a predetermined amount of path length difference between interconnecting waveguides 30 and a corresponding plurality of interconnecting waveguides 34 connected to second free space region 36. Second free space region 36 is connected to a plurality of output waveguides 38.

Waveguides 26 and 38 serve as the input/output ports for the router. Stub waveguides 27, 29, 35, and 37 provide no input or output for the router and merely act to improve optical power transfer to the extremity waveguides in the pluralities of waveguides 26, 30, 34, and 38.

Waveguides 26 and waveguides 38 are all within the central Brillouin zone of the grating, which is known as the field of view for the grating. The input and output waveguides receive first order diffraction optical energy within the router from the grating waveguide region.

Angular opening $2\gamma$ of the central Brillouin zone is given by the following expression: $k \cdot \alpha \cdot \sin \gamma = \pi$, where $k$ equals $2\pi/\lambda$, $\alpha$ equals the spacing of the grating waveguides at the surface of the free space region in the router, and $\lambda$ is the optical signal wavelength. Similarly, the angle $\theta$ of the first order diffraction is defined as $k \cdot \alpha \cdot \sin \theta = \phi, |\phi| < \pi$, where $\phi$ is the phase difference of the optical signals between neighboring grating waveguides. Angle $\theta$ is measured with respect to center axis 200 for the free space region. Accordingly, the angle of the second order diffraction $\theta'$, which is also measured with respect to center axis 200 of the free space region, is computed as $\theta - 2\gamma$ for $\theta > 0$ and as $\theta + 2\gamma$ for $\theta < 0$. The longitudinal axis of the waveguide for capturing the second order diffraction optical energy is disposed to intersect the surface of the free space region at angle $\theta'$ from center axis 200. The frequency of the light captured by the latter waveguide is substantially identical to the frequency of the first order diffracted light captured by the waveguide whose longitudinal axis intersects the same free space region at angle $\theta$.

These waveguide grating routers operate as multiplexers and demultiplexers of optical frequencies. The details of their construction and operation are more fully described in the U.S. patents referred to above, the entire contents of which are hereby incorporated by reference into this application. In the case of waveguide grating router 12 in FIG. 1, input waveguides 26 are connected to the waveguides $14_1$, $14_2, \ldots, 14_N$, respectively and the plurality of output waveguides 38 are connected to the waveguides $16_1, 16_2, \ldots, 16_N$.

In the prior art waveguide grating router shown in FIG. 2, N waveguides 26 are disposed along an outer surface first free space region 28 to collect the first order diffraction light associated with each of the N different wavelengths coupled by the router. There is no higher order diffracted light coupled out of the free space region and delivered to the output port of the waveguide grating router. In general, since the higher order diffracted light at one of the N wavelengths is considered within the loss budget of the router, the design of waveguide grating routers has been customized to reduce the amount of light within the free space region propagating in second and higher order diffraction modes.

In the present invention, each set of N primary waveguides (e.g., waveguides 26 and 38) associated with first order diffracted light from the free space regions of the waveguide grating router is coupled to the output or input ports of the router together with a secondary waveguide which serves as an output coupler waveguide. The additional $(N+1)^{st}$ output waveguide is constructed within the waveguide grating router to capture second order diffraction light at the desired wavelength from one free space region of the router and then couple that captured light to the router output. Of course, such an output coupler waveguide may be constructed on either or both sides of the router.

FIG. 3 shows a simplified diagram of a modified portion of the waveguide grating router having a secondary waveguide for capturing second order diffraction optical energy realized in accordance with the principles of the present invention. The portion of the waveguide grating router shown in FIG. 3 is the first free space region 28 and waveguide connections to one side of that free space region. This is an N×M star coupler of the Dragone patent as modified in accordance with the principles of my invention.

Several of the N primary waveguides 26 are shown as well as secondary waveguide 261, which is the output coupler waveguide. Each waveguide terminates at specific locations on router 12 which connect to waveguides $14_i$ and 15 (shown in FIG. 4). For example, primary waveguide $26_1$ terminates at the location on router 12 to which waveguide $14_1$ is connected. Similarly, primary waveguide $26_2$ terminates at the location on router 12 to which waveguide $14_2$ is connected.

Waveguide 15 is connected to router 12 at the location where secondary waveguide 261 terminates. It is the latter waveguide, secondary waveguide 261, which is designed to capture second order diffracted light from free space region 28 and deliver that captured light to the output of the router. Assuming that the first order diffraction light at the desired wavelength is captured by primary waveguide $26_1$, the second order diffraction light at the desired wavelength is captured by secondary waveguide 261. Primary waveguide $26_1$ is associated directly with secondary waveguide 261 because both waveguides carry light at the same wavelength.

The spacing between grating waveguides 30 at the free space region 28 is $\alpha$. Grating waveguides 30 have their center axes directed to focal point 204 for curved surface 282. Primary waveguides 26 and secondary waveguide 261 have their axes directed to center of curvature 205 for curved surface 281. Waveguide $26_1$ is displaced from the central axis of the free space region by an angle $\theta$. In order to capture the second order diffracted light at the desired wavelength, that is, at the same wavelength found in waveguide $26_1$, waveguide 261 is displaced along the output surface of the free space region by an angle $2\gamma$ measured from the waveguide $26_1$.

Figure 4:
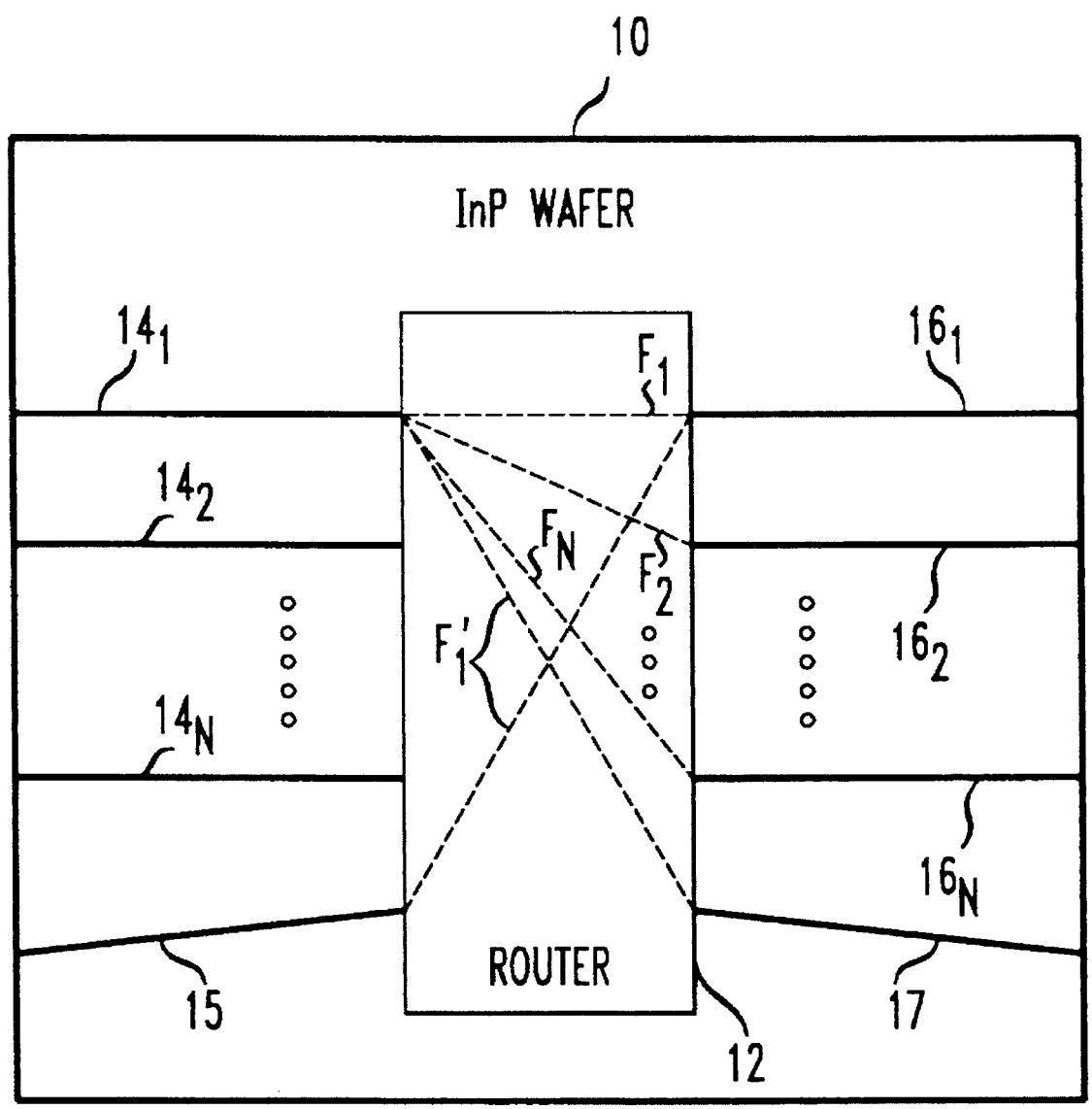
FIG. 4 shows a simplified schematic diagram of an embodiment of the waveguide grating router realized in accordance with the principles of this invention.

FIG. 4 shows an embodiment of the waveguide grating router with output coupler waveguides realized in accordance with the principles of this invention. The N×N portion of the router associated with waveguides 14 and 16 functions as described earlier. Output coupler waveguides 15 and 17 are designed as is shown in FIG. 3 to capture the second order diffracted optical energy. In order to accommodate the router output to waveguide 17, the secondary waveguide must be applied to free space region 36 (FIG. 2) using the angular relationships shown in FIG. 3. In the example shown in FIG. 4, light at frequency $F_1$ exits the router either on waveguides $16_1$ (first order diffraction) and 17 (second order diffraction) when signals are input to the left side of the router or on waveguides $14_1$ (first order diffraction) and 15 (second order diffraction) when signals are input to the right side of the router.

It is understood now that several output coupler waveguides, each associated with a particular one of the N waveguides for the router, can be added to the router structure shown in FIGS. 3 and 4. In addition, it is understood that the output coupler for second order diffraction optical energy can be utilized in K×N waveguide grating routers, where $1 \leq K \leq N$.

Since the waveguide grating router design is symmetric, it is contemplated that a second order output coupler can be incorporated into the reflective version of the router.

Waveguides in the router described above are desirably single mode waveguides. It should be noted that one or more of these waveguides can be fabricated to operate as multimode waveguides.

It is understood that, while the Group III–V material system InGaAsP/InP is described above for fabricating the waveguide grating router, other material combinations may be selected from other semiconductor Group III–V systems such as GaAs/InGaAs, InGaAs/InGaAlAs, InGaAs/InAlAs, GaAs/AlAs, GaAsSb/GaAlAsSb and AlGaAs/GaAs to realize the waveguide grating router. In these semiconductor systems, the layers may be lattice-matched to suitable GaAs or InP substrates. Mismatching is also contemplated wherein strained layers are grown over the substrate material. Finally, extension of the device structures to semiconductor compounds in Group II–VI and Group IV is also contemplated.

The efficiency of this router with the output coupler is that, by incorporating an auxiliary output pathway for energy at the desired frequency, there is no need to tap the main (primary) pathway of the router. This allows the router to deliver 100% power to all outputs, while permitting additional coupling for monitoring and the like without robbing the primary output power.

I claim:

1. A waveguide grating router including at least one primary waveguide and at least one secondary waveguide, both on one side of said router, and N input waveguides on an opposite side of said router, said primary, secondary, and N input waveguides being coupled to corresponding free space regions in which supplied optical energy introducable to the router via one or more of the waveguides is capable of being supported in at least first and second order diffraction modes, said primary waveguide for capturing first order diffraction optical energy at at least one wavelength from corresponding free space regions in said router, and said secondary waveguide for capturing second order diffraction optical energy at the at least one wavelength, the wavelength of optical energy in said primary and secondary waveguides being substantially identical.

2. A waveguide grating router comprising, a plurality of input and output ports on opposite sides of the router, a frequency routing element comprising a plurality of frequency selective pathways optically connecting the input ports to the output ports such that propagation of an optical signal at a selected frequency is supported on one or more of the frequency selective pathways for routing the optical signal from one input port to one output port on a pathway selected as a function of the frequency of said optical signal, and a secondary pathway related to one of the frequency selective pathways for capturing second order diffraction optical energy at the selected one or more frequencies, said secondary pathway supplying the optical signal to an output port of the router.

\* \* \* \* \*